(12) United States Patent
Dalal et al.

(10) Patent No.: US 6,859,902 B1
(45) Date of Patent: Feb. 22, 2005

(54) METHOD AND APPARATUS FOR HIGH SPEED IC TEST INTERFACE

(75) Inventors: Wajih Dalal, Santa Clara, CA (US); Masashi Shimanouchi, Lyons (FR); Robert J. Glenn, San Jose, CA (US); Burnell G. West, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 402 days.

(21) Appl. No.: 09/679,042

(22) Filed: Oct. 2, 2000

(51) Int. Cl.[7] .............................................. G01R 31/28
(52) U.S. Cl. ...................... 714/726; 714/738
(58) Field of Search ................ 714/738, 724, 714/726, 742, 739, 733, 727, 731; 365/230; 370/225

(56) References Cited

U.S. PATENT DOCUMENTS

| | | | | |
|---|---|---|---|---|
| 4,984,161 | A | * | 1/1991 | Hayashi |
| 6,327,678 | B1 | * | 12/2001 | Nagai .......................... 714/700 |
| 6,446,228 | B1 | * | 9/2002 | Kobayashi ................... 714/724 |
| 6,532,561 | B1 | * | 3/2003 | Turnquist et al. ........... 714/738 |
| 6,557,128 | B1 | * | 4/2003 | Turnquist .................... 714/724 |
| 6,557,133 | B1 | * | 4/2003 | Gomes ........................ 714/738 |

* cited by examiner

*Primary Examiner*—Albert Decady
*Assistant Examiner*—Mujtaba Chaudry
(74) *Attorney, Agent, or Firm*—Wagner, Murabito & Hao, LLP

(57) ABSTRACT

A testing method and circuit used to test high-speed communication devices on Automatic Test Equipment—ATE. The method and circuit provide a solution to testing very high speed (2.5 Gbps and above) integrated circuits. The circuit fans out the data streams from the output of the Device Under Test (DUT) to multiple tester channels which under-sample the streams. The testing method and circuit also allow for the injection of jitter into to the DUT at the output of the DUT. The skipping of data bits inherent in multi-pass testing is avoided by duplicating the tester resources to achieve effective real-time capture (saving test time and improving Bit Error Rate). Moreover the circuit synchronizes different DUTs with the timing of ATE hardware independent of DUT output data. Also, a calibration method is used compensate for differing trace lengths and propagation delay characteristics of test circuit components.

7 Claims, 4 Drawing Sheets

METHOD AND APPARATUS FOR HIGH SPEED IC TEST INTERFACE

FIELD OF THE INVENTION

This disclosure relates to testing techniques and circuits for testing high-speed communication devices on Automatic Test Equipment (ATE).

RELATED ART

The challenge in testing high-speed electronic circuit interfaces has been present for several years. In most cases in the past the data rates were ten times the standard rate of the available ATE equipment. Some approaches have used multiplexing to provide a high speed data sources to Devices Under Test (DUTs) typically receiving data input at high speeds. See, for example, "Multiplexing Test System Channels for data rates Above 1 Gbps" by David Keezer—Univ. of South Florida, 1990 International Test Conference, Paper 18.3.

Other data handling solutions previously contemplated are tailored toward SONET and Datacom Ics such as that presented in the paper "Frequency enhancement of digital VLSI systems," by Leslie Ackner & Mark Barber—AT&T Bell Labs, Allentown Pa., 1990 International Test Conference, Paper 22.1. At the DUT output where the DUT output signals are tested and compared to expected values, use of a high bandwidth front end latch is introduced. This latch captures the DUT high data rates through multi-pass testing. Multi-pass testing involves sending a particular high-frequency bit stream through test circuitry multiple times and capturing each successive bit during each "pass," or single time that the entire bit stream travels through the circuitry.

In communication devices and applications for high speed networking devices called serializers and de-serializers (SERDES), under-sampling can be harmful in the sense that it masks test failures. A key test is called the Bit Error Rate Test (BERT), referring to the number of bits that are transmitted incorrectly through the communications channel. This BERT number is measured in Parts Per Million (PPM). This number refers to one bit Error for $10^{20}$ bits transmitted. Under-sampling could potentially mask such errors if it occurs outside of the sampling window. Another technique addresses the problem from the Design-For-Testability standpoint.

Other alternative approaches have been applied to test the DUT. For example, one approach is commonly referred to as the "Loop-back" technique. This method is applicable for SERDES applications. In some electronic devices, a circuit implementing the loop-back is on-chip. This loop-back circuitry connects a serial output pin or port of the device to a serial input pin or port. The advantage of this method is that it is inexpensive and simple to implement. However, there are several disadvantages associated with this method. First, the test data received is restricted to what has been transmitted, which complicates test pattern generation and restricts fault coverage for DUT manufacturing defects. Furthermore, there is no ability to change the input timing. This restricts ability of the testing equipment to characterize the clock recovery mechanism and to inject jitter in order to test the response of the system. The clock recovery mechanism is a mechanism of recovering the clock that is embedded in the data received at the serial input pin or port. Moreover, in non-SERDES applications, a loop-back approach is hard to debug and simulate, as there is no clear data-in and data-out path. In addition, parametric measurements on the serial input such as Minimum Input Voltage cannot be performed unless the loop is opened, and a direct voltage amplitude control is applied to the serial input. Lastly, output timing parameters of the DUT cannot be tested unless the loop is opened.

Another solution to this problem involves integration of external instruments to expand the bandwidth of the ATE equipment. External instruments can be high bandwidth digitizing scopes, or jitter measurement boxes. The interface may be through a GPIB (General Purpose Interface Bus) protocol. The advantage of using external equipment is the ability to expand the test equipment performance without substantial upgrades. It also allows for a simple correlation between the lab bench characterization environment and the ATE environment. The drawbacks of this method are: (1) it requires a complex interface in order to program GPIB drivers and, (2) the test time is lengthened because the typical GPIB interface is very slow and adds to the testing time substantially. Although the GPIB system drivers are typically available, it takes special effort to perform the link between the ATE software interface and the newly integrated instrument. This may require developing a special graphical user interface (GUI) with special driver commands linking to the scope instrument

SUMMARY

The present disclosure is directed to a testing method and circuits to test high speed communication devices on otherwise conventional (lower speed) Automatic Test Equipment (ATE), e.g., testing very high speed (2.5 Gbps and higher operating speed) integrated circuits operating at speeds higher than conventional testing equipment. The circuit fans out the data stream from the output pins or ports of the Device Under Test (DUT) to multiple ATE tester channels. The testing method and design also allow for the injection of jitter into the output of the DUT for testing purposes. Further, the present invention avoids skipping data bits through multi-pass testing (thus saving test time and Bit Error Rate) by duplicating the tester resources to achieve effective real-time capture. Moreover the present method synchronizes different data communication DUTs to the timing of the ATE hardware. Moreover, there is disclosed a calibration method to compensate for differing trace lengths and propagation delay characteristics of test circuitry.

DETAILED DESCRIPTION OF INVENTION

Figure 1:
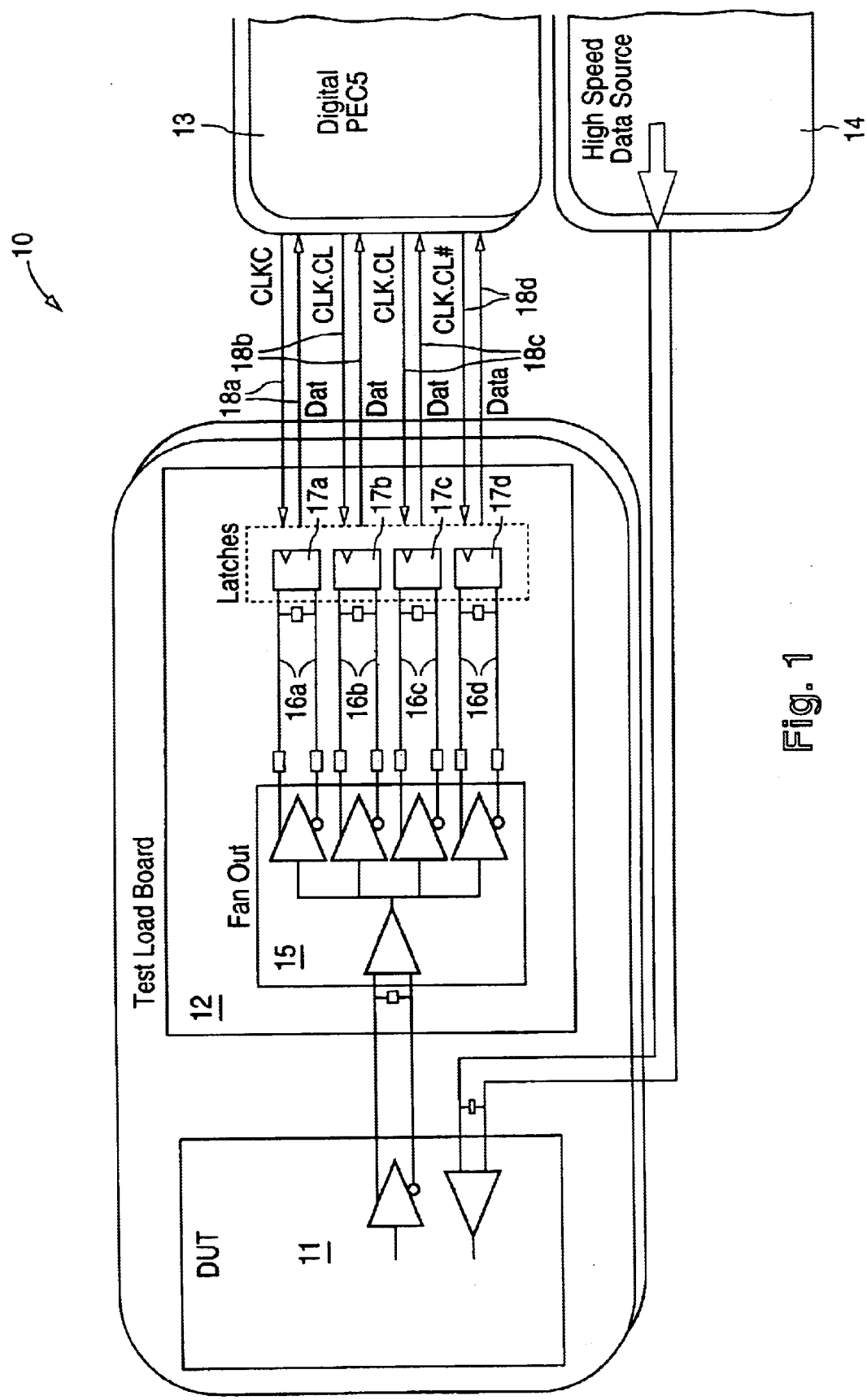
FIG. 1 shows a high-level view of the present test fixture.

FIG. 1 provides a high-level depiction of major components of the present testing system 10. The data rate of test data from the DUT 11 is several times higher than the base data rate of the conventional portions of test system 10. An interface circuit 12 is coupled between the DUT 11 and the tester 13 which includes Digital Pin Electronics (PEC) and software operating the system 10. DUT 11 accepts input from a high speed data source 14, such as a High Speed Clock Card (HSCC), which can be considered a subcomponent of the tester 13. Interface circuit 12 branches the data stream from DUT 11 into multiple tester resources in tester 13. These tester resources, when used in concert, can accept the very high data rates of interest. Assuming a case of data output at a 3.2 Gbps rate from the DUT 11, four tester resources (channels) operating at 800 Mbps each would be required to accommodate the DUT rate (4×800 Mbps=3.2 Gbps). System 10 also handles the bandwidth limitation of the tester channels. The high speed DUT 11 output data stream is transmitted through a fan out circuit 15 that replicates the high speed output of the DUT 11 and send the replicated stream along multiple lines 16a–16d. Part of each data stream exported from the fan out circuit gets latched through one of several high bandwidth latches 17a–17d that is timed differently according to the bit of interest that it is intended to collect from the output of DUT 11. For instance, in the configuration pictured in FIG. 1, latch 17a collects the first bit output by DUT 11, latch 17b to collects the second bit, latch 17c the third bit, and 17d the fourth. Effectively, each branch of the fan out circuit 15 is being under-sampled in the time domain (meaning only every n-th bit in the serial data stream is being latched). By controlling the time at which each latch 17a–17d is enabled to accept inputs from fan out circuit 15 through latch strobe signals 18a–18d (CLK, C) traveling from tester 13 to latches 17a–17d, one effectively captures all the data bits of the serial output stream from the DUT 11 in parallel. These bits are captured by Data lines 18a–18d traveling from latches 17a–17d to tester 13. (Latch strobe signals, when asserted, enable latches 17a–17d to latch onto the value at their respective inputs).

Figure 2:
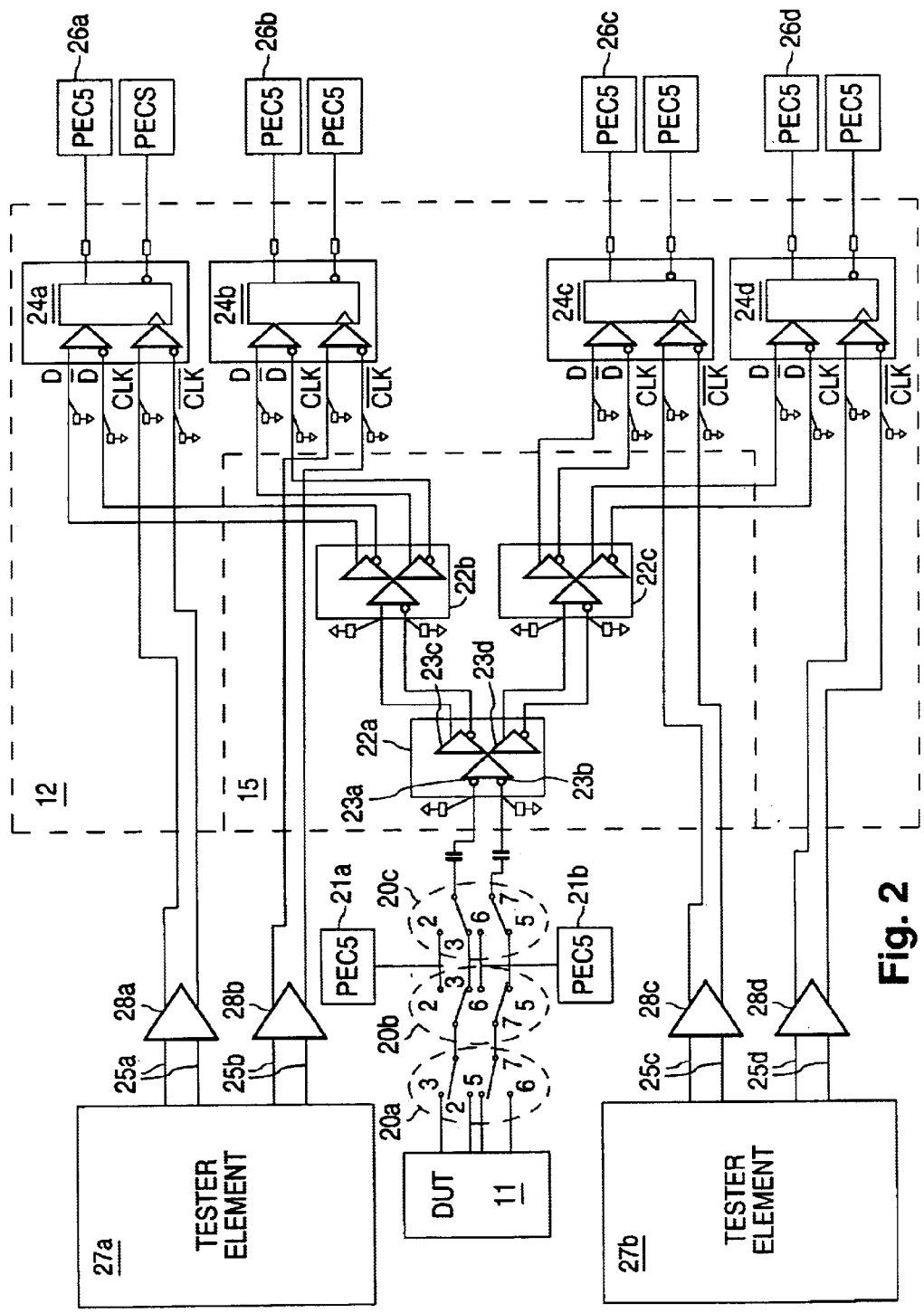
FIG. 2 shows a detailed schematic of the tester circuit.

FIG. 2 shows a more detailed version of the structures in FIG. 1. DUT 11 outputs into a series of relays 20a–20c used to connect exclusively the DUT 11, or calibration pin element (PE) 21a and calibration pin element 21b, to fan out circuitry 15 in the interface circuit 12. Fan out buffers 22a–22c each accept a single input stream of bits and output two "copies" of those bits. Fan-out buffers 22b and 22c operate in a manner identical to that of fan-out buffer 22a, such that the output sent to each of the four latches 24a–24d consists of data streams identical to those inputted into buffer 22a The various latches, buffers, etc. of FIG. 2 are conventional so long as they are capable of operating at an adequate data rate.

Each latch 24a–24d receives data inputs from the fan-out buffers 22b and 22c and latch strobe input signals from strobe line pairs 25a–25d. The signals transmitted on these signal line pairs are controlled by tester elements 27a and 27d, which might be High Speed Clock Cards and are part of the tester 13. Latches 24a–24d, when enabled by their respective latch strobe signals from strobe line pairs 25a–25d, latch data from their data input pins or ports to their output pins or ports. After a period of propagation delay, this output data is then available for pin elements (PE) 26a–26d, which are part of tester 13 in FIG. 1.

Given that the data rates of many DUTs tested by the system 10 are such that timing errors inherent in the components of system 10 can affect the accuracy of testing results, proper adjustments of the edges of DUT strobes must be assured. This data source is controlled by the tester 13. A failure to achieve accurate timing would result in incorrect data being captured by the tester 13 including test elements 26a–26d. Inaccuracies in timing can result from unmatched trace (conductor) lengths from the tester elements 27a–27b to the high speed latches 24a–24d that are not compensated for when the latch strobes signals on lines 25a–25d are enabled so that latches 24a–24d can accept inputs from the DUT 11. Trace lengths can vary to cause as much as 30 picoseconds variation in propagation delay depending on the location and kind of latches 24a–24d used, fan out elements 22a–22c that are used, as well as the impedances of the various traces. The traces typically are made as short as possible and are matched in terms of impedances, but mismatches cannot be fully eliminated. Therefore, mismatches must be compensated for. Inaccuracies in timing can also be caused by unequal propagation delays between the fan out IC components 22a, 22b, 22c that are not compensated for, and unmatched timing edge locations among the tester strobe channels.

So that the tester system 10 will strobe latches 24a–24d at the proper time in order to avoid the problems mentioned in the previous paragraph, the tester system 10 is calibrated before it is used to test DUTs. The following describes a method to calibrate a testing system using the DUT output to generate a signal resembling a clock signal.

When the calibration process is started, the strobe signal generated by tester element 27a travelling on lines 25a attached to the first latch 24a should enable latch 24a to latch the first bit of data from the DUT 11. (the first latch will latch the first bit of data from the DUT) This is performed by having the DUT 11 transmit a repetitive bit stream, e.g., (1010101 . . . ) which simulates a clock signal. Tester 13 searches for the edge transitions (first, second, third transition, etc. . . . ) in the repetitive bit stream at the output pin or port of latch 24a and determines the time required for the transitions to occur when measured from the start of the calibration process. The proper timing of strobe signals which enable the output signal from latch 24a's output pin or port to be read by the testing equipment, can be determined by software in tester 13 from the measured time of these transitions. The strobe signals traveling on lines 25a, which enable a bit transmitted from the DUT 11 to be latched at the input of latch 24a, are programmed by software in tester 13 to enable a bit to be latched at fixed time before the strobe produced by tester 13 enables the output signal from latch 24a's output pin or port to be read by the testing equipment 26a. (an amount larger than the latch 24a propagation delay is sufficient e.g. 500 ps). The strobe signal enabling first latch 24a to latch a bit from the output stream of DUT 11 is programmed to latch the first bit, fifth bit, ninth bit, etc. from the output stream of DUT 11 in the circuit depicted in FIG. 2, because this configuration has four latches 24a–24d. However, more or fewer latches could be included in other embodiments The DUT 11 needs to operate at a sufficiently low speed for calibration such that the data bit width output from the DUT 11 is much longer than the variance in time required for a signal pulse to traverse the various possible paths through the fan-out branches 15. For data rates of interest, a speed of 400 MHz or less is adequate for the DUT output in this calibration mode (400 MHz is equivalent to 2.5 ns). However, the DUT speed cannot be near DC because the system 10 is designed to test DUTs operating at high frequencies.

This calibration method for the first latch strobe traveling on line pair 25a is repeated for the second strobe signal traveling on the second strobe line pair (25b, for example). In this case, the strobe signal enabling the second latch 24b to latch bits from the output stream of DUT 11 is programmed to latch the second bit, sixth bit, tenth bit, etc. from the output stream of DUT 11. The procedure is then applied to all strobe signals for the inputs of the remaining latches. Once this procedure has been performed for all strobe signals transmitted on lines 25a–25d, all strobe signals have a phase that is related to the clock phase of the DUT 11 output at the corresponding latch input location that they strobe. Since the data rate is slow enough, the chance for data bit mixture between the fan-out branches does not exist. The timing of each strobe signal traveling on lines 25a–25d needs to be adjusted to the center between edge transitions at the latch inputs. Once the speed of the DUT 11 is changed to its normal operating speed, the strobe timing is normalized by the software in tester 13 to meet the criteria of the preceding sentence for the (typically, higher) speed.

Another relevant calibration method uses calibration PEs 21a and 21b to calibrate the test system 10, instead of a DUT 11 which outputs a repeating bit pattern. Calibration elements 21a and 21b can simulate the repeating bit pattern output by the DUT 11 when used for calibration purposes.

The present disclosure also includes a synchronization technique. One assumption made in using this technique is that the DUT 11 data output phase delay is repeatable. This means that data transitions always occur at the same time relative to the DUT 11 input signal timing. The data content may not be repeatable, but its timing must be. Another way of describing this repeatability is to say that when the DUT 11 is initialized by the tester 13, the delay between the instant of initialization and when the DUT output clock signal makes its first transition is the same every time a particular DUT 11 is initialized. In the case in which the data output from the DUT 11 is repeatable, no post processing of captured data is required for testing purposes. With a repeatable data output stream, captured data can be compared against expected data for testing purposes.

Figure 3:
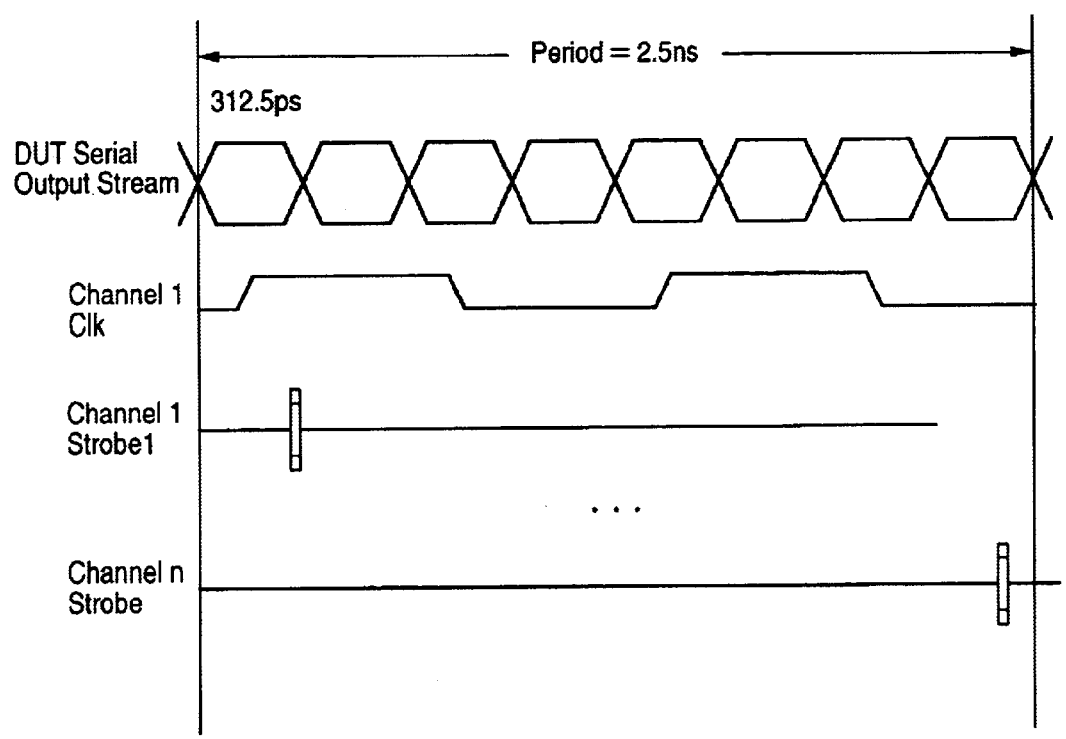
FIG. 3 shows a timing diagram of how tester strobe channels strobe DUT serial output change.

Synchonization is performed by applying strobe signals to a latch such as 24a in the testing circuit at very rapid increments, while the input data at the latch 24a is monitored. The time between initialization of the DUT 11 and when the latch 24a experiences its first transition at their inputs is determined. The time is measured from the instant of initialization to the time at which the first transition at the input reaches 50 percent of its maximum value. This time corresponds to the time required for the latch 24a to begin its first transition at its output pins or ports. Algorithms in the tester 13 determine the clock frequency of an arbitrary DUT 11 that is initialized using this method by using the two timing factors just described In this manner, strobe signals are transmitted allowing the tester 13 to accept DUT 11 output signals from latches 24a–24d just when outputs from the latches 24a–24d are stable and midway between unstable transition periods. Moreover, the synchronization process just described must only be performed for one latch (such as 24a) in order for the timing of strobes for all latch outputs to be determined. The calibration method described above using software in the tester 13 determines propagation delay data for each latch 24a–24d relative to one another, and this data can be used to extrapolate proper strobe times for all latch outputs once the strobe time for one latch 24a is determined. Further, strobes signals for the respective latch 24a–24d outputs are enabled such that successive bits or pulses from the DUT 11 are sent to successive tester data channels 26a–26d, this is illustrated in FIG. 3.

The tester 13 is programmed to strobe output from the latches 24a–24d into the tester data channels 26a–26d at the proper time location set by the synchronization process. The data expected at each tester data channel 26a–26d is a fraction of the original data stream expected from the DUT output. FIG. 3 shows the individual channel timing and expected data.

Figure 4:
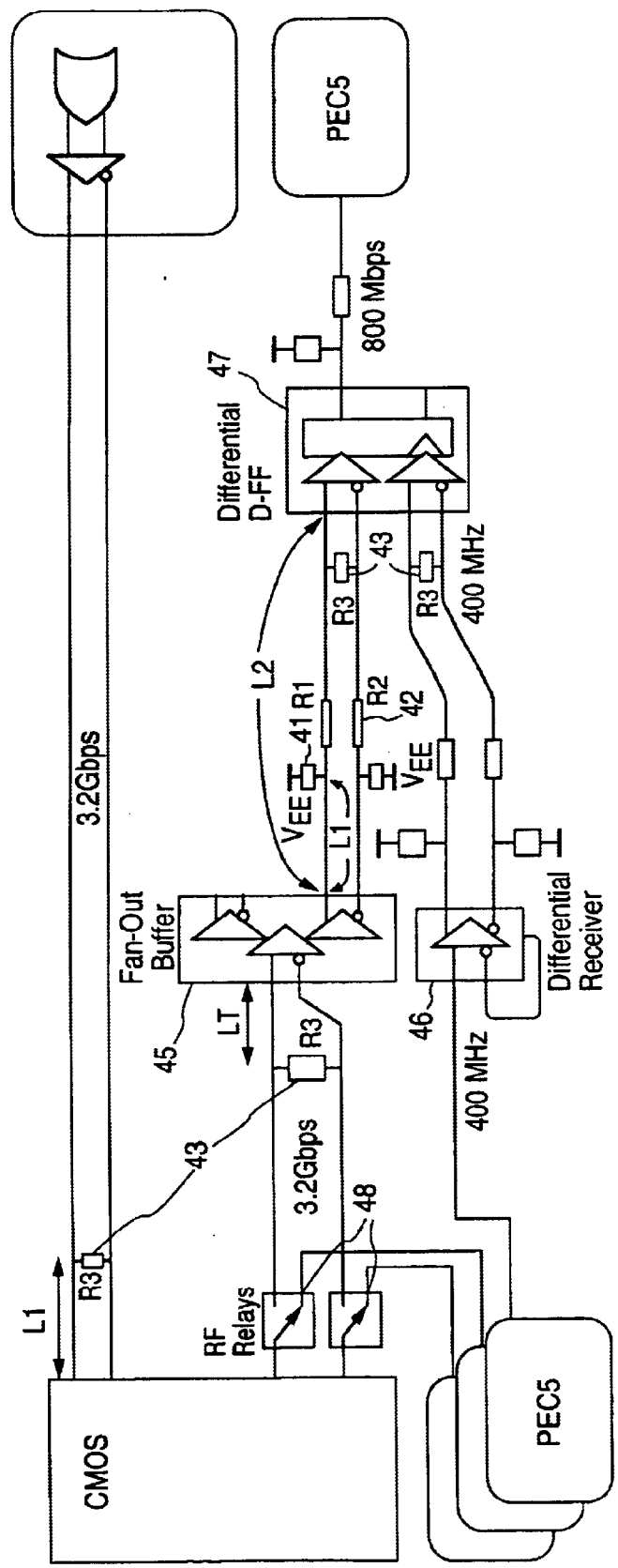
FIG. 4 shows a tester according to one embodiment of the present invention.

As mentioned above, one particular implementation uses high speed networking devices called serializers and de-serializer (SERDES). In one implementation, the components illustrated in FIG. 4 are used. These component values with corresponding drawing reference numbers, are shown below:

Resistors:
  R1=330 Ohm (41)
  R2=43 Ohm (42)
  R3=100 Ohm (43)
Fan Out Buffer: part no. MC10EP11 (45)
Differential Receiver: part no MC10EL16 (46)
High Speed Diff D-FF: part no. MC10EL52 (47)
RF Relays: part no. Teladyne RF103 (48)

The circuit shown in FIG. 4 also uses the ITS9000KX class of tester from Schlumberger.

The circuit components listed above were chosen to address the following:

1. Test Board traces layout to maintain 50 Ohm environment at multi-giga hertz BW.
2. Maintaining matched trace length for different data/clock pairs.
3. Use proper ECL components that will achieve the speeds required.
4. Level adjustment of the ECL circuit to work with a CMOS part and tester channels
5. Working with differential signals in a single-ended test environment. This was addressed by using special converters.

The circuit parameters above are merely illustrative and other parameters can be chosen to implement the DUT output fan out, calibration, and synchronization methods of the present invention.

The disclosure is illustrative and not limiting; further modifications will be apparent to one skilled in the art in light of this disclosure, and are intended to fall within the scope of the appended claims.

What is claimed is:

1. Apparatus for testing an integrated circuit, comprising:
   a data source coupled to the integrated circuit to provide test signals to the integrated circuit;
   a plurality of relays selectively coupling the integrated circuit to the apparatus wherein the integrated circuit is tested;
   a plurality of fan out elements coupled to receive data pulses from the plurality of relays and to distribute the data pulses to a plurality of latches; and
   a strobe element associated with each of the plurality of latches for enabling each of the plurality of latches to transfer the data pulses from an input port to an output port of each lath of the plurality of latches.

2. The apparatus of claim 1, further comprising testing components of said apparatus each coupled to the receive the data pulses from one of the plurality of latches, the testing components of said apparatus receiving the data pulses at a frequency that is a fraction of the output signal frequency of the integrated circuit being tested.

3. The circuit network of claim 2, wherein the fraction is equal to the output frequency of the integrated circuit being tested divided by the number of the latches.

4. A method of testing an integrated circuit comprising the acts of:
   providing an integrated circuit;
   applying signals to an input port of the integrated circuit;
   fanning out data pulses received from an output port of the integrated circuit;
   distributing each of the data pulses to one of a plurality of latches; and calibrating a time at which each one of the plurality of latches is enabled by a strobe element.

5. The method of claim 4, further comprising the acts of:

measuring the time between initialization of the integrated circuit and detection of a first data pulse at an input port of a selected one of the plurality of latches;

calculating a clock frequency of the integrated circuit therefrom, and;

testing the integrated circuit after the measuring and calculating are performed.

6. The method of claim 4, further comprising the act of transmitting a repetitive bit stream with alternating voltage levels from the integrated circuit to calibrate a time at which each one of the plurality of latches is enabled.

7. The method of claim 4, further comprising the act of edge transitions at the output terminal of each one of the plurality of latches thereby to calibrate a time at which each one of the plurality of latches is enabled.

* * * * *